US012772496B2

(12) United States Patent
Gardner et al.

(10) Patent No.: US 12,772,496 B2
(45) Date of Patent: Oct. 20, 2026

(54) 3D FIELD EFFECT TRANSISTOR (FET) DEVICE HAVING U-SHAPED CHANNEL STRUCTURE

(71) Applicant: Tokyo Electron Limited, Tokyo (JP)

(72) Inventors: Mark I. Gardner, Cedar Creek, TX (US); H. Jim Fulford, Marianna, FL (US); Partha Mukhopadhyay, Oviedo, FL (US)

(73) Assignee: Tokyo Electron Limited, Tokyo (JP)

( * ) Notice: Subject to any disclaimer, the term of this patent is extended or adjusted under 35 U.S.C. 154(b) by 719 days.

(21) Appl. No.: 18/093,205

(22) Filed: Jan. 4, 2023

(65) Prior Publication Data

US 2023/0261113 A1 Aug. 17, 2023

Related U.S. Application Data

(60) Provisional application No. 63/311,239, filed on Feb. 17, 2022.

(51) Int. Cl.
*H10D 30/67* (2025.01)
*H10D 30/01* (2025.01)
(Continued)

(52) U.S. Cl.
CPC ....... *H10D 30/6713* (2025.01); *H10D 30/031* (2025.01); *H10D 30/6728* (2025.01);
(Continued)

(58) Field of Classification Search
CPC ............. H10D 30/6713; H10D 30/031; H10D 30/6728; H10D 30/6757; H10D 62/151; H10D 62/292; H10D 84/83; H10D 62/80; H10D 84/85; H10D 84/02; H10D 88/00; H10D 84/0128; H10D 84/038; H01L 21/762; H01L 21/76816; H01L 21/76819; H01L 21/7684; H01L 21/76877; H01L 25/0657; B82Y 10/00; H10W 10/011; H10W 10/10; H10W 20/056; H10W 20/062; H10W 20/089; H10W 20/092; H10W 90/00
See application file for complete search history.

(56) References Cited

U.S. PATENT DOCUMENTS 4,455,740 A * 6/1984 Iwai ........................ H01L 21/32
257/E29.13
4,954,854 A * 9/1990 Dhong ................. H10D 30/608
257/E29.267

(Continued)

*Primary Examiner* — Caleb E Henry
(74) *Attorney, Agent, or Firm* — Oblon, McClelland, Maier & Neustadt, L.L.P.

(57) ABSTRACT

A semiconductor device includes a substrate with a working surface and a transistor formed in the substrate. The transistor includes a complex channel structure which is vertically arranged with respect to the working surface. The complex channel structure includes first and second source-drain (S-D) ends which are provided in a plane extending along the working surface to define an opening to a bounded region of the complex channel structure. The transistor also includes a gate dielectric layer formed on the complex channel structure within the bounded region, and a gate metal layer formed on the gate dielectric layer within the bounded region to form the transistor.

12 Claims, 6 Drawing Sheets

(51) Int. Cl.

| | |
|---|---|
| ***H10D 62/13*** | (2025.01) |
| ***H10D 62/17*** | (2025.01) |
| ***H10D 84/83*** | (2025.01) |
| ***H10W 10/00*** | (2026.01) |
| ***H10W 10/10*** | (2026.01) |
| ***H10W 20/00*** | (2026.01) |
| ***H10W 90/00*** | (2026.01) |

(52) U.S. Cl.
CPC ....... *H10D 30/6757* (2025.01); *H10D 62/151* (2025.01); *H10D 62/292* (2025.01); *H10D 84/83* (2025.01); *H10W 10/011* (2026.01); *H10W 10/10* (2026.01); *H10W 20/056* (2026.01); *H10W 20/062* (2026.01); *H10W 20/089* (2026.01); *H10W 20/092* (2026.01); *H10W 90/00* (2026.01)

(56) References Cited

U.S. PATENT DOCUMENTS

| | | | | | |
|---|---|---|---|---|---|
| 5,882,972 | A * | 3/1999 | Hong | H10B 20/00 | 257/E27.102 |
| 6,075,270 | A * | 6/2000 | Okihara | H10D 30/021 | 257/E29.267 |
| 6,555,872 | B1 * | 4/2003 | Dennen | H10D 30/635 | 257/E21.429 |
| 7,919,811 | B2 * | 4/2011 | Akiyama | H10D 30/668 | 257/329 |
| 2005/0079676 | A1 * | 4/2005 | Mo | H10D 30/665 | 257/E29.066 |
| 2014/0183451 | A1 * | 7/2014 | Hirai | B82Y 10/00 | 257/191 |
| 2014/0264562 | A1 * | 9/2014 | Cheng | H10D 12/038 | 438/270 |
| 2016/0118398 | A1 * | 4/2016 | Yon | H10B 43/27 | 438/269 |
| 2016/0133742 | A1 * | 5/2016 | Okuda | H01L 23/544 | 438/270 |
| 2018/0342613 | A1 * | 11/2018 | Chang | H01L 21/76224 | |
| 2020/0105782 | A1 * | 4/2020 | Guo | H10B 43/27 | |
| 2021/0066335 | A1 * | 3/2021 | Ouyang | H10D 64/037 | |
| 2021/0384354 | A1 * | 12/2021 | Karda | H10B 41/50 | |
| 2022/0077188 | A1 * | 3/2022 | Wang | H10B 41/27 | |
| 2023/0079098 | A1 * | 3/2023 | Togo | H10D 64/513 | 257/345 |

* cited by examiner

3D FIELD EFFECT TRANSISTOR (FET) DEVICE HAVING U-SHAPED CHANNEL STRUCTURE

INCORPORATION BY REFERENCE

This present disclosure claims the benefit of U.S. Provisional Application No. 63/311,239, titled 3D UFET DEVICE FOR ADVANCED 3D INTEGRATION filed on Feb. 17, 2022, which is incorporated herein by reference in its entirety.

FIELD OF THE INVENTION

The present disclosure generally relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

SUMMARY

The present disclosure is directed towards a semiconductor device and a method to fabricate a semiconductor device.

Aspect (1) includes a semiconductor device. The semiconductor device includes a substrate with a working surface and a transistor formed in the substrate. The transistor includes a complex channel structure which is vertically arranged with respect to the working surface. The complex channel structure includes first and second source-drain (S-D) ends which are provided in a plane extending along the working surface to define an opening to a bounded region of the complex channel structure. The transistor also includes a gate dielectric layer formed on the complex channel structure within the bounded region, and a gate metal layer formed on the gate dielectric layer within the bounded region to form the transistor.

Aspect (2) includes the semiconductor device of aspect (1), wherein the complex channel structure includes a first channel portion including the first S-D end and extending along a vertical direction perpendicular to the working surface to a first distal end. The transistor also includes a second channel portion including the second S-D end and extending along the vertical direction to a second distal end.

Aspect (3) includes the semiconductor device of aspect (2), wherein the first and second distal ends are connected to complete the complex channel structure.

Aspect (4) includes the semiconductor device of aspect (3), and further includes a third channel portion that extends in a horizontal direction along the working surface and connects the first and second distal ends to complete the complex channel structure.

Aspect (5) includes the semiconductor device of aspect (4), wherein the gate dielectric layer comprises a conformal layer formed on the first, second, and third channel portions to form a complex dielectric structure.

Aspect (6) includes the semiconductor device of aspect (5), wherein the gate metal fills a bounded region of the complex dielectric structure.

Aspect (7) includes the semiconductor device of aspect (4), wherein the complex channel structure has a U-shape in a vertical plane that is perpendicular to the working surface.

Aspect (8) includes the semiconductor device of aspect (1), and further includes a first wiring layer formed over the semiconductor device, the wiring layer comprising electrical connections that connect to the gate metal and the first and second S-D ends.

Aspect (9) includes the semiconductor device of aspect (6), wherein the complex channel structure includes a conductive oxide layer and the gate dielectric layer includes a high-k dielectric material.

Aspect (10) includes the semiconductor device of aspect (1), and further includes a plurality of complex channel structure transistors formed in the substrate.

Aspect (11) includes the semiconductor device of aspect (10), wherein the substrate and the plurality complex channel transistors collectively define a first transistor sheet and a second transistor sheet is located above the first transistor sheet. The second transistor sheet includes a second substrate disposed on the first substrate and a second plurality of complex transistors. The second substrate includes a second working surface opposite the first working surface. The second plurality of complex channel transistors are located within the second substrate. The second plurality of complex channel transistors each have first and second S-D ends.

Aspect (12) includes the semiconductor device of aspect (11), wherein one of the first transistor sheet and the second transistor sheet is n-type doped and the other is p-type doped.

Aspect (13) includes the semiconductor device of aspect (11), wherein a plurality of additional transistor sheets are disposed atop the first transistor sheet.

Aspect (14) includes a method of fabricating a semiconductor device. The method of fabricating a semiconductor device includes the steps of: depositing a first dielectric layer on a substrate; pattern etching a well into the first dielectric layer; depositing channel material into the well; depositing gate dielectric material into the well; depositing gate metal into the well; and planarizing the device down to the first dielectric layer.

Aspect (15) includes the method of aspect (14), wherein the channel material comprises a conductive oxide.

Aspect (16) includes the method of aspect (15), wherein the channel material further comprises a conformal layer of 2-D material disposed on the conductive oxide.

Aspect (17) includes the method of aspect (14), wherein between the step of depositing gate metal and the step of planarizing the device, the method further includes the steps of: pattern etching insulating wells between the gate metal and the channel material; and depositing an insulating dielectric layer on the device.

Aspect (18) includes the method of aspect (14), wherein, the planarization down to the first dielectric layer exposes the channel material, forming a complex channel with a first and second source-drain (S-D) ends; and the planarization down to the first dielectric layer exposes the gate metal region of the gate electrode material.

Aspect (19) includes the method of aspect (18), wherein the planarization down to the first dielectric layer forms a transistor block, and the method further includes the step of forming a plurality of transistors from the transistor block.

Aspect (20) includes the method of aspect (19), wherein the forming of a plurality of transistors comprises the steps of: pattern etching divisions in the transistor block; depositing a second dielectric layer on the device; planarizing the device down to the source-drain ends; depositing a third dielectric layer on the device, pattern etching wiring wells above the S-D and gate metal ends; depositing a first conductive wiring layer onto the device; and planarizing the device down to the third dielectric layer such that discrete electrical connections are formed between the first wiring layer and each of the S-D and gate metal ends.

Aspect (21) includes the method of aspect (20), wherein the planarizing of the device down to the third dielectric layer forms a first transistor sheet and the method further includes the steps of: depositing a fourth dielectric layer on the first transistor sheet; forming a second transistor block in the fourth dielectric layer; and forming a plurality of transistors from the second transistor block.

Aspect (22) includes a method of microfabrication. The method of microfabrication includes the steps of: depositing an isolation dielectric layer on a substrate; forming openings within an isolation dielectric layer on a substrate; conformally depositing channel material within the openings without completely filling the openings; conformally depositing gate metal on the channel material without completely filling the openings; filling the remaining space of the openings with a first conductor; and removing portions of the channel material, gate metal, and first conductor that are above a top surface of the isolation dielectric layer, resulting in a U-shaped channel transistor structure.

BRIEF DESCRIPTION OF THE DRAWINGS

Various embodiments of this disclosure that are proposed as examples will be described in detail with reference to the following figures, wherein like numerals reference like elements, and wherein:

FIG. 5 is a sectional view of a sheet of complex channel transistors formed by the processes of FIGS. 1-4.

FIG. 6 is a sectional view of a sheet of complex channel transistors formed by another example embodiment of the disclosed invention.

FIGS. 8 and 9 are sectional views of a sheet of complex channel transistors with a 2D material layer formed by another example embodiment of the disclosed invention.

DETAILED DESCRIPTION OF EMBODIMENTS

Figure 1:
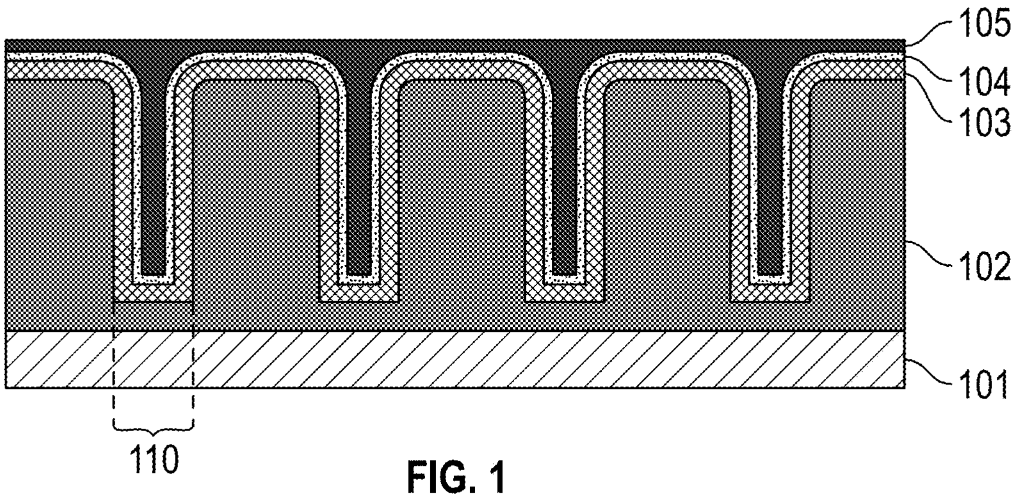
FIGS. 1, 2, 5, 6, 8 and 9 are sectional views of intermediate structures in a process for manufacturing complex channel transistors in accordance with an example embodiment of the disclosed invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein in reference to various fabrication methods have been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques disclosed herein include methods and designs for a complex channel structure transistor or a complex field effect transistor. A complex transistor design herein is one in which all transistor connections can be made from the top of the transistor. For example, all of source, drain, and gate connections can be made in one plane on top of the transistor. Any deposited channel can be used including conductive oxide (semi-conductive oxide), 2D material, and large grain semiconductors. The electron or hole flow in the channel, flows from one source-drain (S-D) end, down into the substrate and back up to the other S-D end in the same xy plane as the first S-D end. This channel path enables smaller devices to be more compact in 3D stacking. Off state leakage currents are superior to single crystal silicon with conductive oxides. This device architecture can be used for all access transistors for memory cells (i.e., 3D DRAM, 3D NAND and so forth). The complex transistor build herein can be integrated for all transistor applications, N devices, CFET, side by side for N devices tall. One benefit of techniques herein is that very few mask layers are required for each xy plane of transistors.

Techniques provided herein may use alternative semiconductors in the microfabrication of semiconductor devices. Such semiconductors herein can be alternatives to silicon, germanium, gallium arsenide, and other commonly used semiconductors. Semiconductors and structures herein can include semiconductive oxides, semiconductive 2D materials, and semiconductive materials. This includes semiconductors (materials) that can be formed at relatively low temperatures and without epitaxy.

Semiconductive materials herein may have properties similar to elemental semiconductor materials and can be used to fabricate vertical stacks or planes of transistors. Note that, given transistors within the vertical stacks can have channels with horizontal or vertical orientation relative to a working surface of the substrate. Certain materials, when combined with oxygen, may form new materials that exhibit semiconductor properties. For example, these semiconductor materials can turn "off" with low off-state leakage current or can become highly conductive under certain circumstances. In other words, such materials have an electrical conductivity value falling between an electrical conductor and an electrical insulator. Some examples of N-type semiconductive materials for channels include In2O3, SnO2, InGaZnO, and ZnO. One example of a P-type semiconductive material for channels is SnO. Thus, a "semiconductive oxide" herein is an oxygen-containing material having semiconductor properties. Additionally, or alternatively, materials and channels may comprise a 2D material. Some exemplary 2D materials for use in forming a channel include, but are not limited to, WS2, WSe2, WTe2, MoS2, MoSe2, MoTe2, HfS2, ZrS2, TiS2, GaSe, InSe, phosphorene, and other similar materials. A "semiconductive 2D material" herein is a 2D material with semiconductor properties. The 2D materials described herein may be deposited by, for example, an atomic layer deposition (ALD) process and may be 5-15 angstroms thick, the thinness lending to their name—2D material. Other deposition techniques may also be used, including, but not limited to, chemical vapor deposition (CVD), physical vapor deposition (PVD), and plasma-enhanced deposition techniques. The materials may be annealed during or after the device formation process to recrystallize or grow the crystals and thereby improve electrical characteristics. Thus, forming a semiconductive material can include deposition and annealing. A "semiconductive material" herein can be any material with semiconductor properties. Such materials can include elements or compounds normally associated with dielectrics. Such materials can include compounds formed without requiring a seed layer and can be formed at temperatures lower than about 500-600 degrees Celsius.

Semiconductive materials that can be formed/deposited on a substrate without requiring a seed layer and/or at processing temperatures lower than 600 degrees Celsius are beneficial in forming vertical stacks or planes of transistors (3D transistors). In contrast, semiconductors used to make conventional semiconductor devices are often formed by epitaxy, which requires a seed layer for growth. Requiring a seed layer can mean a need to uncover a particular material on a substrate that might be covered by many layers and structures. As can be appreciated, without needing to integrate access to a seed layer into a given fabrication flow, a semiconductive material can be easily formed over an existing plane of transistors to create an additional plane of transistors. Moreover, formation of conventional semiconductors can require high temperature deposition and annealing (greater than about 600 degrees Celsius). After initial high temperature processing, additional materials are added that may not tolerate high temperature processing. This means that if a first plane of transistors is formed, adding a second plane of transistors that needs high temperature processing can damage the first plane of transistors, leading to device failure. Accordingly, semiconductor materials that can be formed at less than 600 degrees Celsius are desirable. Without requiring a seed layer or high temperature processing, semiconductive materials herein can be formed on many different surfaces, easily integrate with various fabrication flows, and help enable vertical stacking of transistors.

Example embodiments will now be described with reference to the figures. The figures described herein reference one embodiment of the complex transistor which generally takes a U-shape, herein referred to as a UFET or U-shaped field effect transistor. One of ordinary skill in the art will appreciate from the present disclosure that the complex channel can have any geometry which generally facilitates an electron path from one S-D end to another in the same xy plane, without departing from the scope of the present invention. Accordingly, while the embodiments described herein refer to the formulation of UFET transiters, the same fabrication processes can be applied to the fabrication of any complex transitor such as a V-shaped transistor. There are many process flows that can be used to create complex transistors herein. Flow A' describes a UFET transistor formed using a semiconductive oxide channel. Flow B' describes a UFET transistor formed using a semiconductive oxide and 2D material channel. Flow C' describes a flow B' UFET built on top of a Flow A' UFET. One of ordinary skill in the art can appreciate from the present disclosure that any combination of the aforementioned flows or steps can be combined without departing from the scope of the present invention. Also, NMOS UFET planes can be integrated above PMOS UFET planes in any order.

FIG. 1 illustrates the intermediate structure of an early step in an example process flow for the fabrication of a complex channel structure transistor. The process can begin by depositing an isolation dielectric layer 102 on a base substrate material 101. Next, a photoresist mask is applied, and the device is etched to form transistor wells 110. These wells 110 are isolated from the base substrate 101 by an unetched region of isolation dielectric 102. This is followed by the removal of the photoresist which leaves open wells 110. Next semiconductive oxide 103 is deposited conformally across the device to form the complex channels of the invention in the wells 110, however the deposition is preformed such that the wells 110 remain partially unfilled in the center. Next a layer of gate dielectric material 104 is similarly deposited conformally and incompletely such that a central region remains unfilled. This remaining unfilled region is then filled by a layer of gate metal 105 which is deposited across the device.

Figure 2:
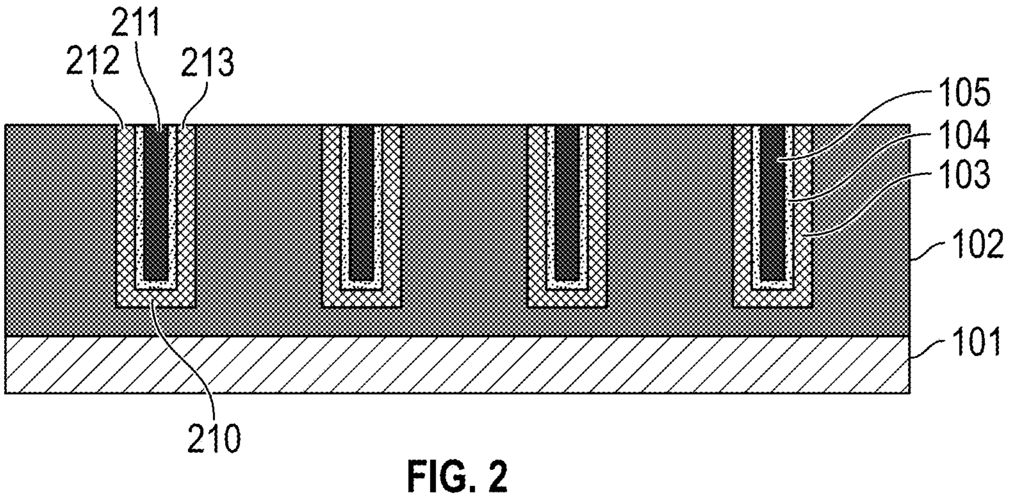

FIG. 2 illustrates the next step of the example process flow, wherein the overburden region of the device is removed by way of planarization down to the isolation dielectric layer 102. This planarization may be accomplished through any process which removes materials in a controlled fashion such as chemical-mechanical polishing (CMP). This planarization creates a working surface of the device and exposes the first and second Source-Drain contact regions 212, 213, as well as the gate metal contact region 211. The complex channel structure is vertically arranged with respect to the working surface, and the first and second S-D ends are provided in a plane extending along the working surface to define an opening to a bounded region of the complex channel structure. In the example of FIG. 2, the channel structure includes a first channel portion including the first S-D end and extending along a vertical direction perpendicular to the working surface to a first distal end, and a second channel portion including the second S-D end and extending along the vertical direction to a second distal end. The first and second distal ends are connected by a third channel portion that extends in a horizontal direction along the working to complete the U-shaped channel structure of this example embodiment. The bounded region of the U-shaped channel structure is formed by an imaginary line connecting the S-D ends of the channel structure.

Figure 3:
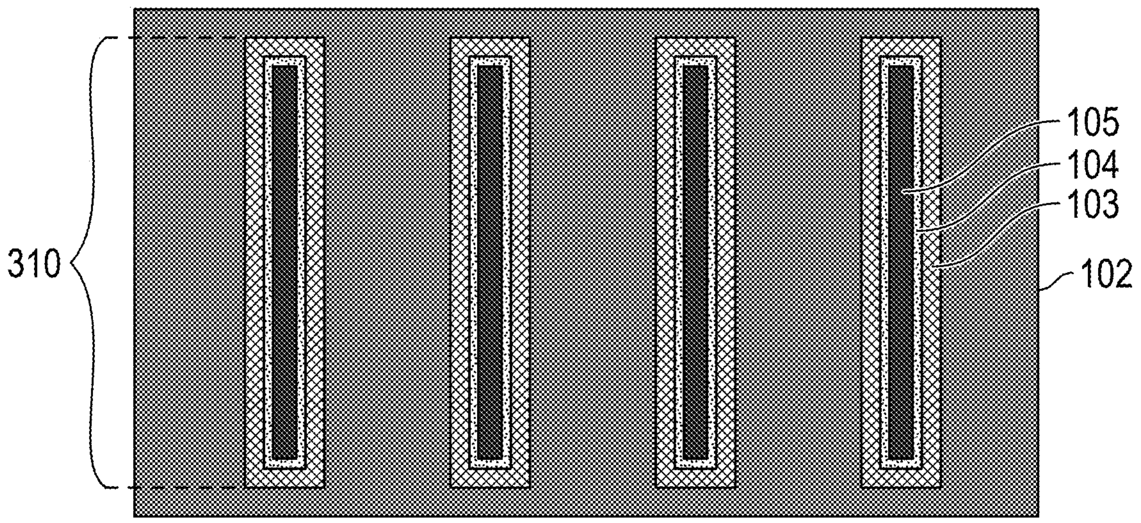
FIGS. 3 and 4 are perspective views of intermediate structures in a process for manufacturing complex channel transistors in accordance with an example embodiment of the disclosed invention.

FIG. 3 illustrates the example structure at the stage shown in FIG. 2 from above.

As shown in FIG. 3 the planarization down to the dielectric layer 102 creates a transistor block 310 which will ultimately be segmented to produce individual complex transistors 410.

Figure 4:
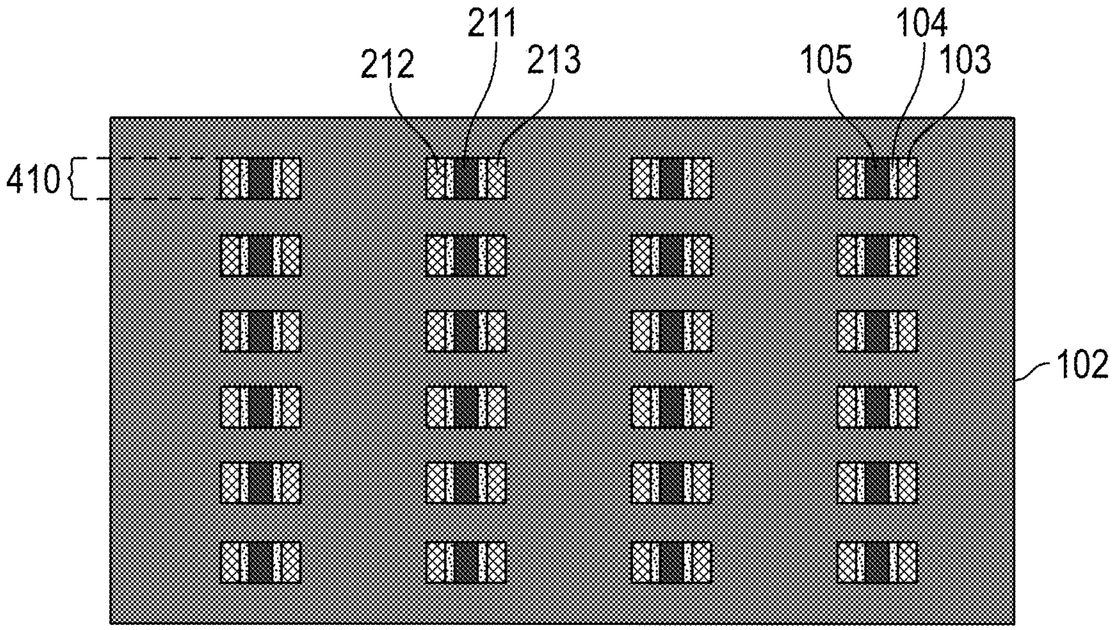

FIG. 4 illustrates the example structure after segmentation. This segmentation occurs through the application of a photoresist mask and etching to form free regions between individual transistors 410. These free regions are then filled via the deposition of another layer of isolation dialectic material 102 and further planarization via CMP back down to the working surface. At this point, the individual transistor blocks 310 have been divided into discrete complex transistors 410. The complex transistors pictured herein can have different sizes or uniform sizing. Differing sizes can be defined by the etch mask. One of ordinary skill in the art will apricate that variable sizing can be beneficial for different applications. For example, while uniform sizing is useful for memory applications, having different sizes enables some devices to be higher voltage or lower voltage.

Figure 5:
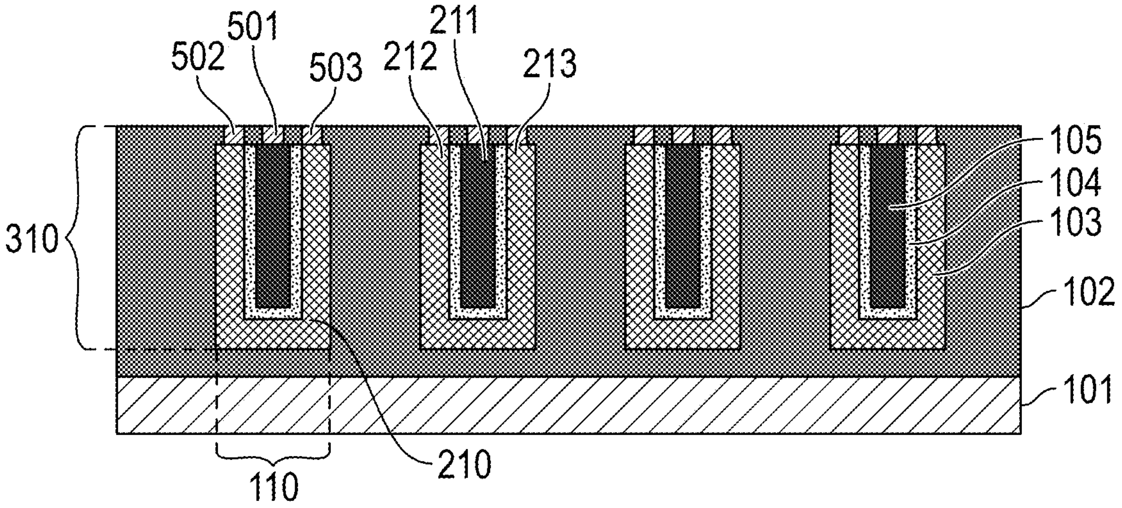

As illustrated in FIG. 5, connections can now be made to first and second S-D contacts 212, 213 and the gate metal contact region 211. These connections are made by another isolation dielectric layer 102 deposition followed by masking and etching to form wiring connection regions. These regions are then be filled through the deposition of a conductive wiring layer and a final planarization down to the isolation dialectic 102 layer to form first and second S-D hookups 502, 503 atop the first and second S-D contacts 212, 213 respectively. This process also forms a gate metal hookup 501 atop the gate metal contact region 211. A key feature of the complex transistors formed by this process is that these hookups can all be made in a one pass process on the top of the device in a single xy plane.

Figure 6:
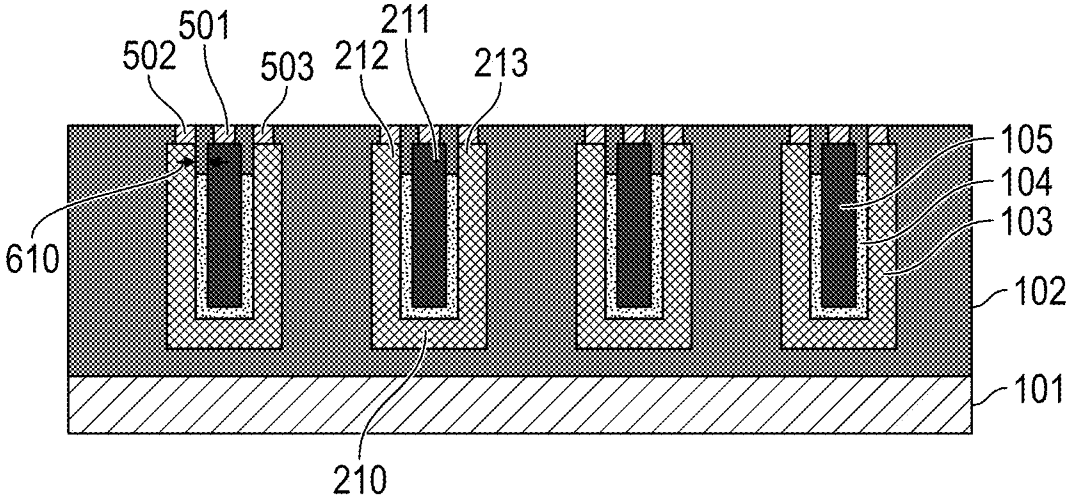

FIG. 6 illustrates an alternative example embodiment of the present invention, wherein prior to the deposition of the wiring layer, an additional photoresist masking and etching step is performed. This process removes a portion of the gate dialectic layer 103 to form gate isolation regions 610 between the conductive oxide layer 103 and the gate metal 105. These isolation regions 610 are filled via isolation dialectic 102 deposition and the device is planarized down to the working surface before the wiring layer is introduced.

Figure 7:
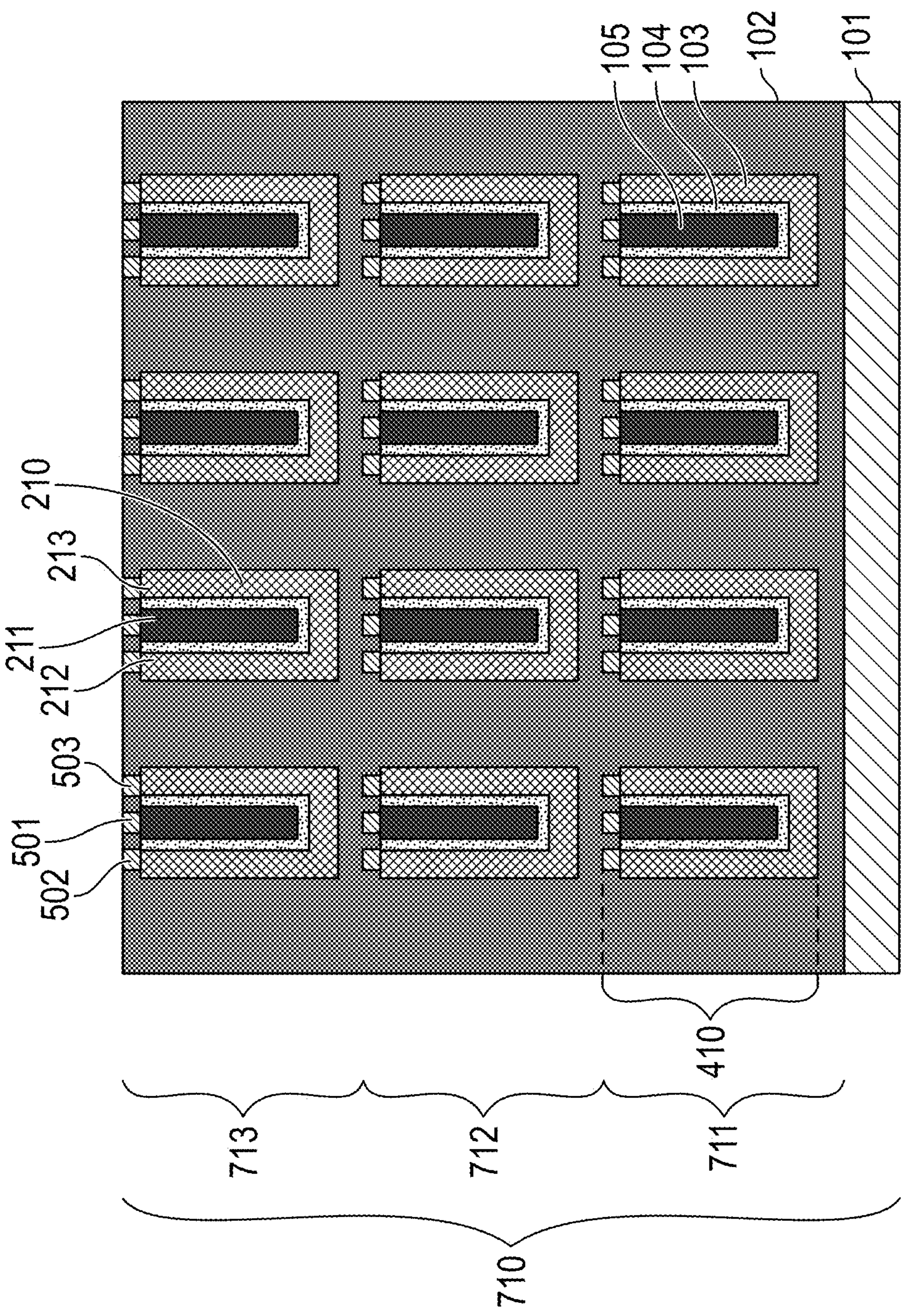
FIG. 7 is a sectional view of a semiconductor device comprised of multiple sheets of complex channel transistors formed by formed by the process of FIGS. 1-4.

FIG. 7 illustrates a three-dimensional stack 710 of complex transistor sheets 711 fabricated in the steps illustrated in FIGS. 1-6. These additional sheets 712, 713 are compiled atop the first sheet 711 through a nearly identical fabrication process, wherein the working surface of the first sheet 711 replaces the base substrate 101. Upon the completion of the second sheet 712, a third sheet 713 may be likewise added. This process may be repeated any number of times without departing from the scope of the present invention.

Figure 8:
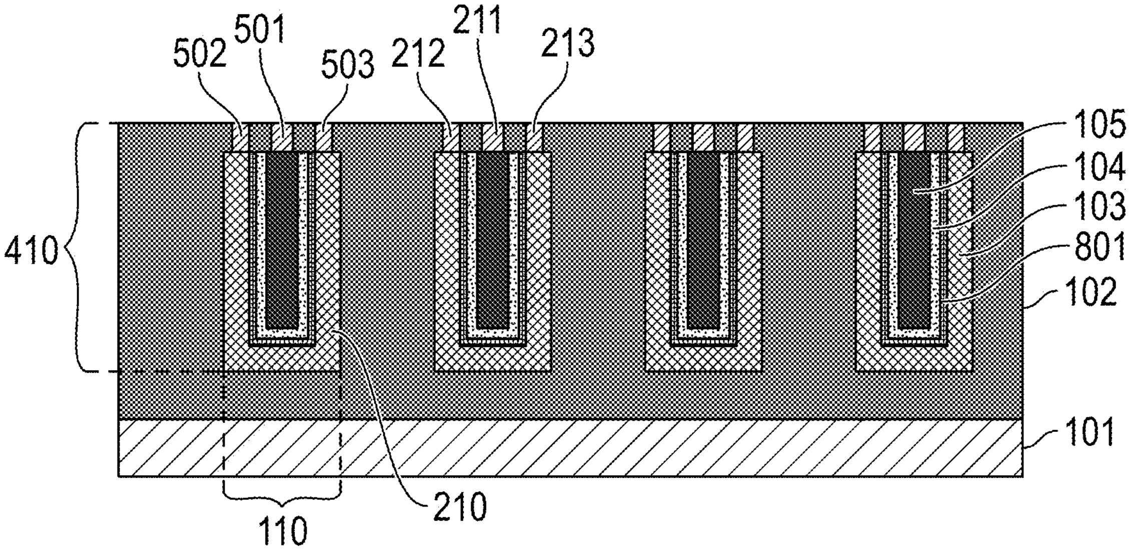

FIG. 8 illustrates the end product of the Flow B' process wherein similar individual complex channel transistors 410 to those from the Flow A' process illustrated in FIGS. 1-6 are formed. The Flow B' process differs in that between the deposition of the conductive oxide layer 103 and the gate dielectric layer 104, there is an additional conformal deposition of a 2D material layer 801. The Flow B' process is otherwise identical to Flow A' and ultimately produces similar discrete complex transistors 410 with a 2D layer 801.

Figure 9:
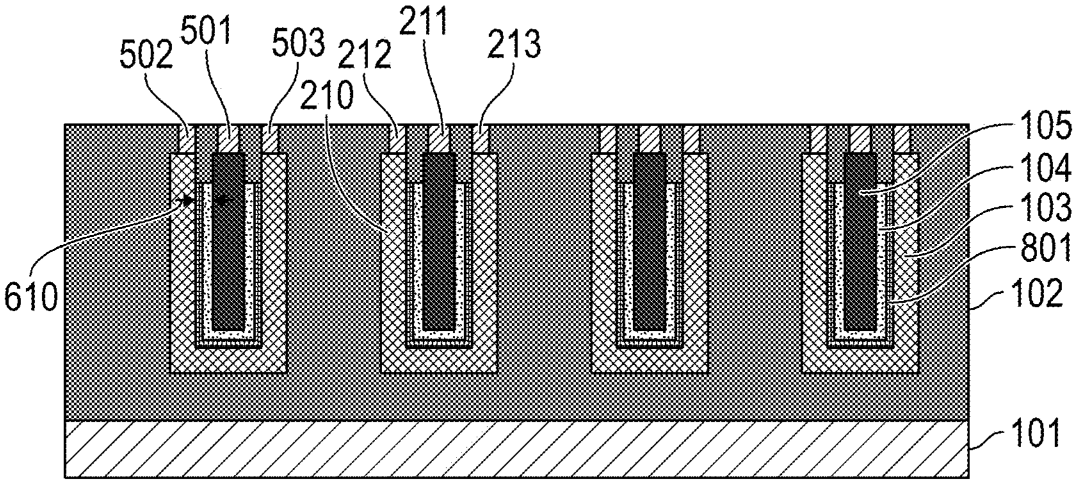

FIG. 9 illustrates an alternative embodiment of the Flow B' complex transistor, wherein like the semiconductor device illustrated in FIG. 6, gate isolation regions 610 are formed to electrically isolate the conductive oxide 103 from the gate metal 104. In the embodiment of FIG. 9, the ends of the semiconductive oxide and gate dielectric material are not coplanar with the ends of the channel structure and gate structure. Isolation regions 610 are filled via isolation dialectic 102 deposition and the device is planarized down to the working surface before the wiring layer is introduced. Similarly, in some embodiments, the first and second S-D contacts 212, 213 and the gate metal contact region 211 are note coplanar with each other but are accessible from the top of the substrate such that hook-ups 501, 502 and 503 may be formed in one process step.

Figure 10:
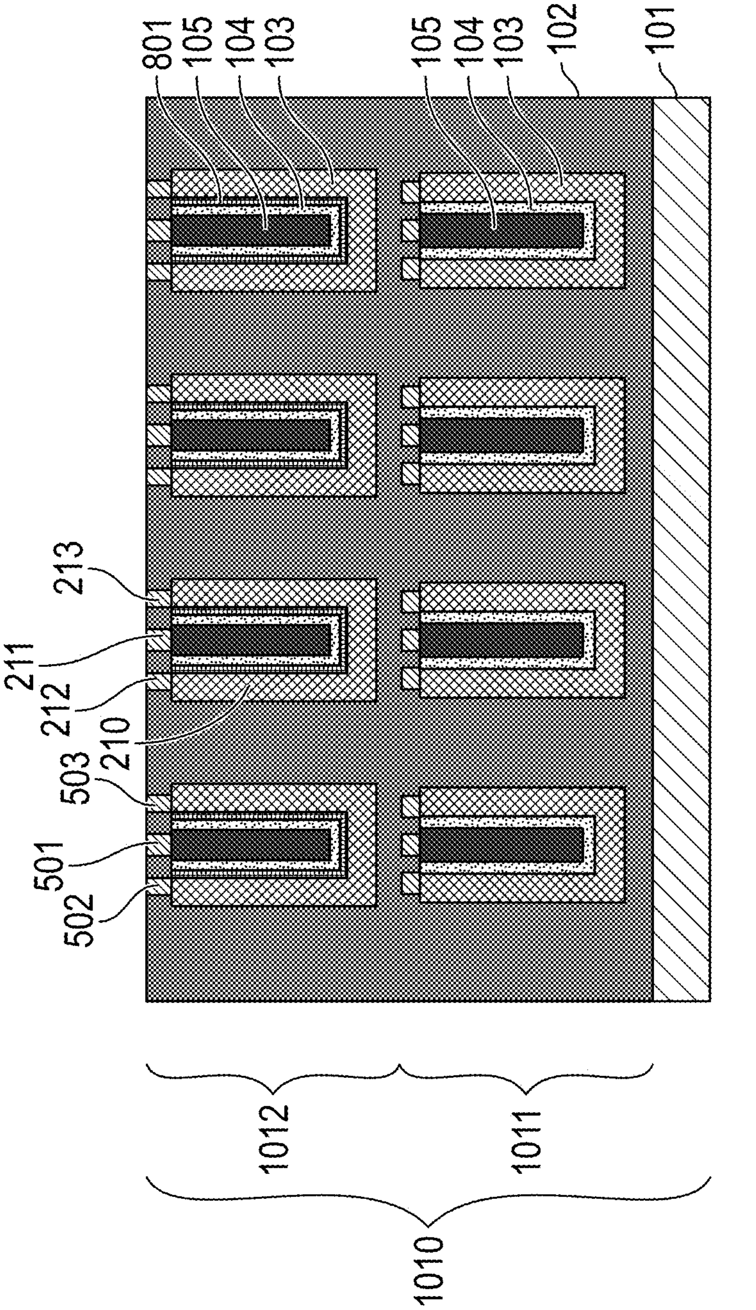
FIG. 10 is a sectional view of a semiconductor device comprised of alternating sheets of complex channel transistors depicted in FIGS. 3 and 8.

FIG. 10 illustrates the ultimate product of the Flow C' process, wherein alternating layers of Flow A' sheets 1011 and Flow B' sheets 1012 are formed atop one another to produce a single Flow C' 3D stacked semiconductor device 1010. The process for the formulation of these alternating layers is identical to the stacking process illustrated in FIG. 7, however the Flow B' process simply uses the working surface of the Flow A' sheet 1012 to build open instead of the working surface of a Flow B' sheet. One of ordinary skill in the art will appreciate from the present disclosure that any combination or ordering of complex transistor sheets can be stacked to produce a 3D stacked semiconductor device 1010 without departing from the scope of the present invention.

Doping concentrations in the upper tier of devices may be different from the lower tier of devices. For example, the Si body 1005 of the upper tier may be lightly n-doped and p+-implanted layers 1007 and 1105 formed for junction transistors. With different polarity of Si in the lower and upper tiers of devices, different metal may be used for S-D contacts of the lower and upper tier devices. Different gate metal may also be used to match with polarity of Si in the vertical channel.

The Si device layers and vertical channel structures may be made from semiconductor materials such as Si, Ge, SiGe, GaAs, InAs, InP, semiconductive behaving oxide (e.g. $In_2O_3$, $SnO_2$, InGaZnO, and ZnO, SnO), 2D material (e.g. $WS_2$, $WSe_2$, $Wte_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, etc.) or any other suitable semiconductor material in monocrystalline and/or polycrystalline form. Further, the vertical channel structures may be doped with either p-type or n-type dopants at various doping concentration levels. The p-type dopant may be boron and the n-type dopant may be phosphorus or arsenic, however other suitable dopant materials may be used. Various techniques may be used to provide a strained channel material to improve carrier mobility, for example. In some embodiments, the vertical channel structure of the lower transistor tier and the vertical channel structure of the upper transistor tier may have the same material composition, but in other embodiments, the vertical channel structures can be different from one another. For example, both vertical channel structures may be NMOS, both vertical channel structures may be PMOS, or one of the vertical channel structures may be NMOS while the other vertical channel structure is PMOS.

The doped Si may also be made from any semiconductor material in monocrystalline or polycrystalline form and doped with either p-type or n-type dopants at various doping concentration levels. The S-D regions of the lower and upper tiers of devices may be made of the same or different semiconductor materials from each other and may be the same or a different material as their respective vertical channel structures. The S-D regions may have the same or a different doping type as their respective vertical channel structures and may have the same or different doping concentration as their respective vertical channel structures. Various S-D contact engineering techniques known in the semiconductor fabrication art may be employed in the design and formation of S-D regions. For example, the S-D regions may include S-D extensions.

Insulation and dielectric layers may be implemented as a dielectric material such as SiO, SiN, SiON, SiC, SiOC, SiCN, SiOCN, the like, or a combination thereof. These structures may also be implemented as high-k dielectrics. The same or different dielectric materials can be used for these structures. Device contacts, connections vias and the like may be made of any conductive material, such as a doped polysilicon material or a metal such as W, Co, Ru, Cu, Al, the like, or combinations thereof. The same or different conductor materials can be used for these structures.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

What is claimed is:

1. A semiconductor device comprising:

a substrate comprising a working surface; and a transistor formed in the substrate, the transistor comprising:

a complex channel structure which is vertically arranged with respect to the working surface, the complex channel structure comprising first and second source-drain (S-D) ends provided in a plane extending along the working surface to define an opening to a bounded region of the complex channel structure, a gate dielectric layer formed on the complex channel structure within the bounded region, and a gate metal layer formed on the gate dielectric layer within the bounded region to form the transistor, wherein:

the complex channel structure comprises a conductive oxide laver; and the gate dielectric layer comprises a high-k dielectric material.

2. The semiconductor device of claim 1, wherein the complex channel structure comprises:

a first channel portion including the first S-D end and extending along a vertical direction perpendicular to the working surface to a first distal end; and a second channel portion including the second S-D end and extending along the vertical direction to a second distal end.

3. The semiconductor device of claim 2, wherein the first and second distal ends are connected to complete the complex channel structure.

4. The semiconductor device of claim 3, further comprising a third channel portion that extends in a horizontal direction along the working surface and connects the first and second distal ends to complete the complex channel structure.

5. The semiconductor device of claim 4, wherein the gate dielectric layer comprises a conformal layer formed on the first, second and third channel portions to form a complex dielectric structure.

6. The semiconductor device of claim 5, wherein the gate metal fills abounded region of the complex dielectric structure.

7. The semiconductor device of claim 4, wherein the complex channel structure has a U-shape in a vertical plane that is perpendicular to the working surface.

8. The semiconductor device of claim 1, further comprising a first wiring layer formed over the semiconductor device, the first wiring layer comprising electrical connections that connect to the gate metal and the first and second S-D ends.

9. The semiconductor device of claim 1, further comprising a plurality of complex channel structure transistors formed in the substrate.

10. A semiconductor device comprising:

a substrate comprising a working surface;

a transistor formed in the substrate, the transistor comprising:

a complex channel structure which is vertically arranged with respect to the working surface, the complex channel structure comprising first and second source-drain (S-D) ends provided in a plane extending along the working surface to define an opening to a bounded region of the complex channel structure, a gate dielectric layer formed on the complex channel structure within the bounded region, a gate metal layer formed on the gate dielectric layer within the bounded region to form the transistor; and a plurality of complex channel structure transistors formed in the substrate, wherein:

the substrate and the plurality complex channel transistors collectively define a first transistor sheet; and a second transistor sheet is located above the first transistor sheet, the second transistor sheet further comprising:

a second substrate disposed on the first substrate and having a second working surface opposite the first working surface; and a second plurality of complex channel transistors located within the second substrate, each having first and second S-D ends.

11. The semiconductor device of claim 10 wherein one of the first transistor sheet and the second transistor sheet is n-type doped and the other of the first transistor sheet and the second transistor sheet is p-type doped.

12. The semiconductor device of claim 10, wherein a plurality of transistors sheets are disposed atop the first transistor sheet.

* * * * *